(12) United States Patent
Cigada et al.

(10) Patent No.: US 6,518,099 B2
(45) Date of Patent: Feb. 11, 2003

(54) PLATED LEADFRAMES WITH CANTILEVERED LEADS

(75) Inventors: Andrea Giovanni Cigada, Milan (IT); Fulvio Silvio Tondelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/899,461

(22) Filed: Jul. 5, 2001

(65) Prior Publication Data

US 2001/0041385 A1 Nov. 15, 2001

Related U.S. Application Data

(62) Division of application No. 09/263,320, filed on Mar. 5, 1999, now Pat. No. 6,323,544.

(51) Int. Cl.[7] .......................... H01L 21/44; H01L 21/48; H01L 21/50
(52) U.S. Cl. ........................................ 438/123; 438/121
(58) Field of Search ............................... 438/121, 123

(56) References Cited

U.S. PATENT DOCUMENTS

| | | | |
|---|---|---|---|
| 4,894,782 A | 1/1990 | Murata et al. ............... | 361/421 |
| 4,951,119 A | 8/1990 | Yonemochi et al. .......... | 357/70 |
| 5,635,755 A | 6/1997 | Kinghorn ..................... | 257/666 |
| 5,650,661 A | 7/1997 | Mathew ....................... | 257/677 |
| 5,767,574 A | 6/1998 | Kim et al. ..................... | 257/677 |
| 5,801,436 A | 9/1998 | Serizawa ..................... | 257/677 |
| 5,977,620 A | 11/1999 | Kim et al. ..................... | 257/677 |
| 5,994,767 A | 11/1999 | Huang et al. ................ | 257/666 |
| 6,034,422 A | 3/2000 | Horita et al. ................ | 257/677 |
| 6,037,653 A | 3/2000 | Kim et al. ................... | 257/666 |

Primary Examiner—Albert W. Paladini
Assistant Examiner—David A. Zarneke
(74) Attorney, Agent, or Firm—Allen, Dyer, Doppelt, Milbrath & Gilchrist, P.A.; Lisa K. Jorgenson

(57) ABSTRACT

A metal frame patterned by die stamping has the outermost end portion of each patterned pin extending freely, without constraints, from a line of metal bridge connections (dam bar). The end face of each pin is also covered, as well as other surfaces of the frame, by a coating layer or multilayer of metals different from the metal of the die stamped frame. The coating layer or multilayer contains at least on its outer surface, a noble metal such as palladium or gold. The tip of the pins are not subject to cutting and/or trimming after plating the die stamped frame. The pins are not even cut or trimmed during separation of the patterned frame from the surrounding metal at the end of the encapsulation process, when the pins are then eventually bent into shape.

15 Claims, 6 Drawing Sheets

PLATED LEADFRAMES WITH CANTILEVERED LEADS

RELATED APPLICATION

This application is a divisional of Ser. No. 09/263,320 filed on Mar. 5, 1999, now U.S. Pat. No. 6,323,544, the disclosure of which is hereby incorporated by reference in its entirety.

FIELD OF THE INVENTION

The present invention relates to the field of integrated circuits and, more particularly, to an assembling frame for a surface mount integrated circuit.

BACKGROUND OF THE INVENTION

Pre-coating the leads or pins of a metal frame is a time consuming technique, especially with increasingly small sizes and increased densities of the pins. The leads or pins are commonly die stamped copper or Fe/Ni alloy for soldering onto a printed circuit board with an eutectic Sn/Pb alloy.

Recent developments have provided alternative techniques based on the use of assembling die stamped metal frames pre-coated with a layer or a multilayer of metals or alloys exhibiting a high compatibility with silicon dice assembling operations. Compatibility is also exhibited with the soldering of the connecting wires, as well as with the eventual soldering of the tips of the pins of the device on respective metal pads. The metal pads are defined on the printed circuit board. The soldering is a conventional soldering technique using an eutectic Sn/Pb alloy.

The use of die stamped frames of copper or of any other adequate metal are becoming more frequent. These frames are pre-coated with a nickel and/or a nickel-palladium and/or a gold film. The coatings, whose thickness may range between 1 and 2 $\mu$m, are very effective in promoting an adequate wettability of the coated pin surfaces by the molten eutectic Sn/Pb alloy used in assembling the devices on the printed circuit board. Manufacturers of integrated devices have the opportunity of eliminating from the fabrication process the steps of pre-coating the pins with eutectic alloy, or any other plating treatment of the metal frames. These items may be purchased from specialized suppliers already pre-coated with the above noted metal films chemically or galvanically deposited onto the entire die-stamped frame.

On the other hand, conventional die stamping of a copper strip produces a modular patterning of several frames in special stamping molds. The various functional features or portions of each frame remain connected to each other and to the surrounding metal, or to a second line of connecting metal bridges referred to as a connection bar. They will be separated during the final steps of the fabrication process of the integrated devices. Only after completing the encapsulation of the device, the single pins are separated from the surrounding metal or from the connection bar. Also, the pins themselves are separated by cutting the metal bridge connections along the so-called perimetral dam bar line, upon which abut the edges of the mold used for encapsulating with resin the integrated device during the assembling process. The pins are also separated by a perimetral trimming performed internally of the outermost perimeter of the die stamped area of each frame during the patterning thereof, before or after bending the pins. The array of adjacent pins are separated, trimmed and bent into shape using dedicated molds, or by the use of special bending devices. The bending devices include interpin cutters and tip trimming devices. As a result, the pins have a precise shape to superficially mount them on a printed circuit board.

FIGS. 1a and 1b show metal frames defined by die stamping a copper strip, as well as details of the patterning of the pins. A broken line indicates the perimeter of the cut performed after encapsulation, and the dash and dot lines indicate the cuttings that are performed to break the metal bridge connections along the so-called dam bar. FIGS. 2a, 2b and 2c illustrate forming operations of the pins carried out by rolling, as well as the final cutting and trimming of the tips of the pins. FIGS. 3a and 3b show an alternative technique of forming and trimming the pins by using cam mechanisms.

The shaping, cutting and trimming techniques of the pins of the encapsulated device always involve a cutting of the outer end or tip of the pins. For conventional pre-tinned pins, as shown in FIG. 4, soldering to the pad of the printed circuit normally has an optimal web configuration. In the case of thin film precoated metal frames, for example, with a nickel-palladium alloy or with gold, the soldering takes a more critical configuration, as depicted in FIG. 5.

The frames plated with thin metal films are extremely thin and the wettability of the cut end surface of the pins by the molten eutectic Sn/Pb alloy during the soldering of the surface mount devices on the printed circuit board is often inadequate to reliably establish a good electrical and mechanical connection of the pin to the respective metal pad. The thin metal films typically include nickel, nickel-palladium, gold and similar metals or alloys. This is especially so for the most external or top coating film, which usually contains a noble metal, such as palladium or gold, and may or may not be alloyed to other metals.

The reasons for such a different performance of pre-tinned frames from that of pre-plated frames with a noble metal containing a thin top coating, even though both are subjected to trimming, are not clear. For instance, when trimming a copper frame pre-coated with a rather thick layer of tin, the cut end surface of the pins remains sufficiently wettable by the eutectic Sn/Pb alloy during the soldering phase. of the devices onto the board. This is by virtue of a significant smearing of the tin over the cut surface by the cutting blade.

In contrast, pre-coating the frames with nickel-palladium, gold, and similar metal films containing a noble metal, with a thickness marginally smaller than that of the tin layer of a tinned frame, does not provide a significant transfer of noble metal on the cut face of the pins. Therefore, the wettability of the bare copper of the trimmed end of the pins is inadequate to ensure an optimal shape of the web of solder.

SUMMARY OF THE INVENTION

It is an object of the present invention to provide a frame of copper or of other metals or alloys, pre-coated with thin metal films, the outermost of which contains a noble metal that has a pattern configuration that overcomes the above mentioned wettabiliy problems by the molten eutectic tin/ lead alloy which is normally pre-deposited onto the printed circuit board. Moreover, the frame simplifies the finishing steps of the fabrication process for the devices while reducing the metal discards. The frame improves usage of the starting sheet metal strips on which the frames are patterned by stamping.

According to the present invention, a metal frame patterned by die stamping has the outermost end portion of each patterned pin extending freely, without constraints, from a line of metal bridge connections (dam bar). The end face of each pin is also covered as any other surface of the frame by a coating layer or multilayer of metals different from the metal of the die stamped frame. The coating layer or multilayer contains at least on its outer surface, a noble metal such as palladium or gold. The tip of the pins are not subject to any cutting and/or trimming after plating the die stamped frame. The pins are not even cut or trimmed during separation of the patterned frame from the surrounding metal at the end of the encapsulation process. Next, the pins are eventually bent into shape.

The end surface of each pin of the finished integrated device is covered by the deposited coating containing noble metal as well as coating other parts of the metal frame. Thus, the pins remain perfectly wettable by the molten eutectic Sn/Pb alloy when the devices are soldered onto a printed circuit board. Consequently, an optimal mechanical and electrical connection of each pin to the respective pad of the printed circuit is assured with high reliability.

BRIEF DESCRIPTION OF THE DRAWINGS

The various aspects and advantages of the invention will become even more evident through the following description of an embodiment and by comparing it with frames made according to known techniques, while referring to the attached drawings, wherein.

DETAILED DESCRIPTION OF THE PREFERRED EMBODIMENTS

Figure 1B:
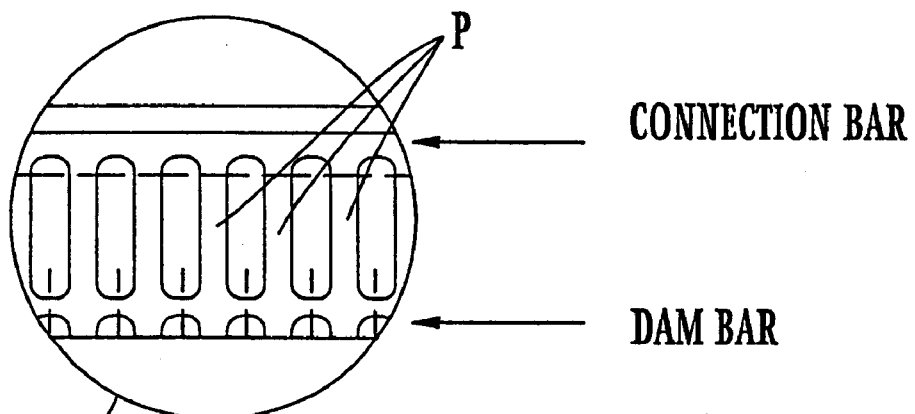
FIGS. 1a and 1b show frames patterned by die stamping, and enlargements of the outermost portion of the pins, according to the prior art.
Figure 1A:
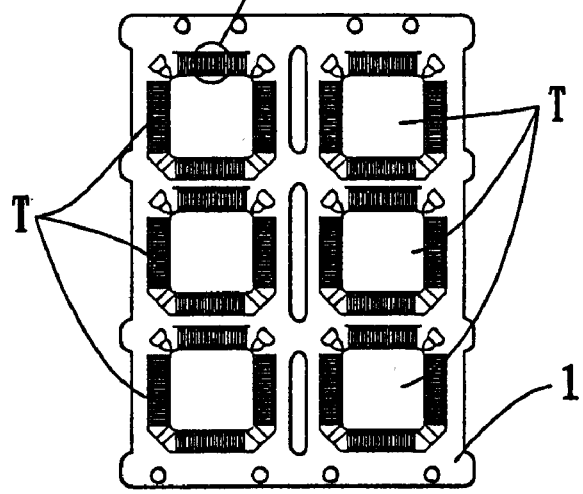

As already mentioned above, a common patterning configuration of metal frames for surface mount devices is shown in FIGS. 1a and 1b. FIG. 1a depicts six frames T defined by die stamping a strip of copper or alloy plate, for example, an alloy of Fe and Ni. The enlarged partial view of FIG. 1b shows in more detail the profile of the pins P. That is, the outermost portion of them are shown, starting from a continuous line (dam bar) of metal bridge connections to a continuous line (connection bar) of outermost metal bridge connections. The dot and dash lines indicate the lines of cuttings that are required to electrically separate one pin from the adjacent ones. The broken lines indicate the line of the perimetral cutting that is made at the end of the assembling steps to separate the various devices.

Figure 2A:
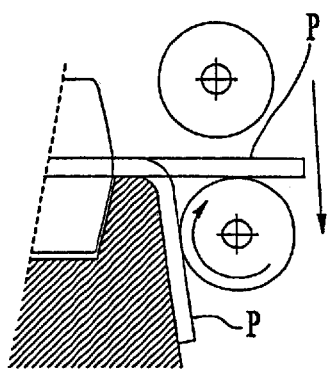
FIGS. 2a, 2b, 2c, 3a and 3b illustrate common cutting, forming and end trimming processes of the pins, according to the prior art.
Figure 2B:
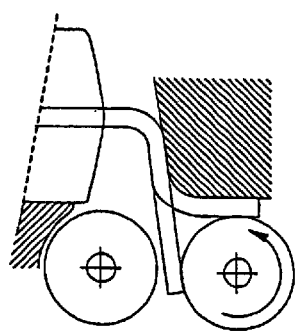
Figure 2C:
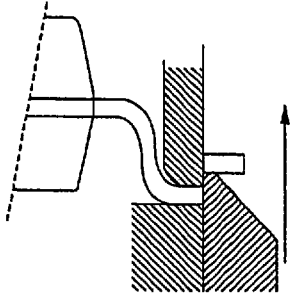
Figure 3A:
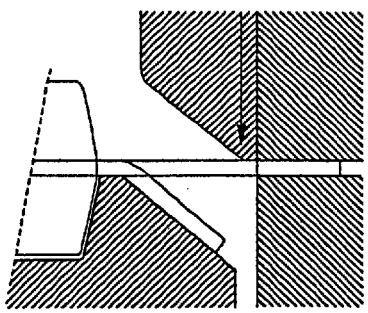
Figure 3B:
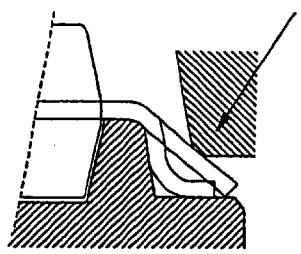
Figure 4:
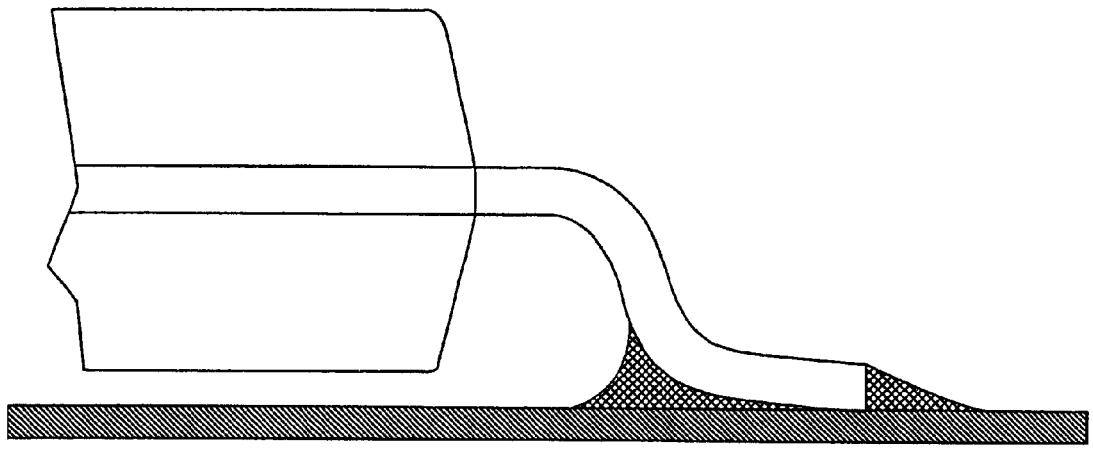
FIGS. 4 and 5 show a comparison between an efficient solder web configuration and a less efficient or critical solder web configuration, according to the prior art.
Figure 5:
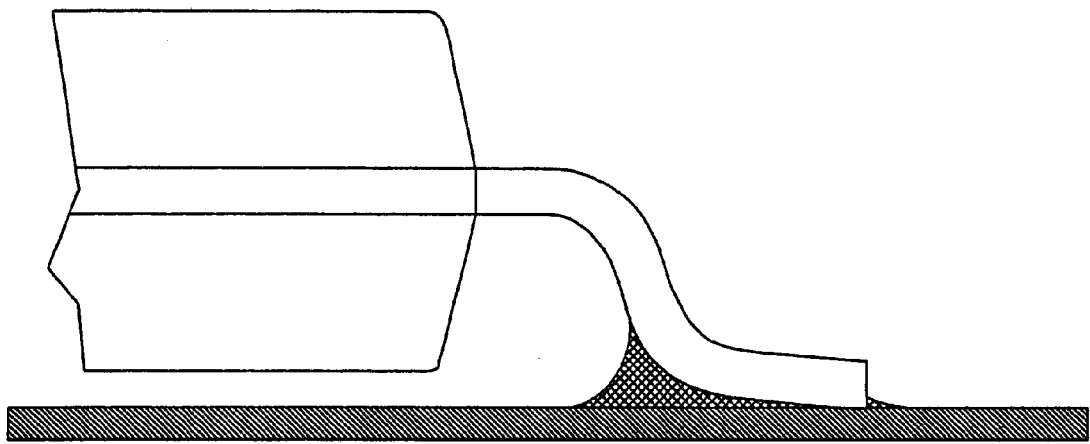

FIGS. 2a, 2b and 2c show the bending steps by rolling the pins P, and FIG. 2c shows cutting the ends of the pins as a final separation-trimming step. FIGS. 3a and 3b illustrate an alternative technique in which the pins are cut before being bent to shape. FIG. 4 depicts pictorially a solder web cross section of an optimal soldering of a pin onto a respective pad of the printed circuit board, as normally obtained with pre-tinned frames. FIG. 5 depicts pictorially a solder web cross section of an unsatisfactory soldering of a pin onto a respective pad of the printed circuit board. This is often observed with frames pre-coated with a thin film of nickel and a palladium-nickel alloy or palladium or gold top coating, according to a known technique.

Figure 7:
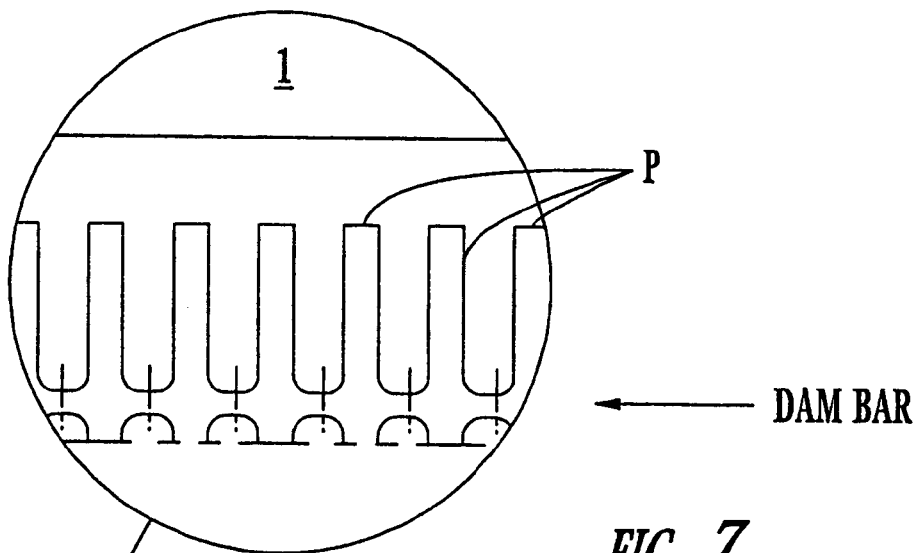
FIGS. 6 and 7 are plan views of die stamped frames made according to the present invention.
Figure 6:
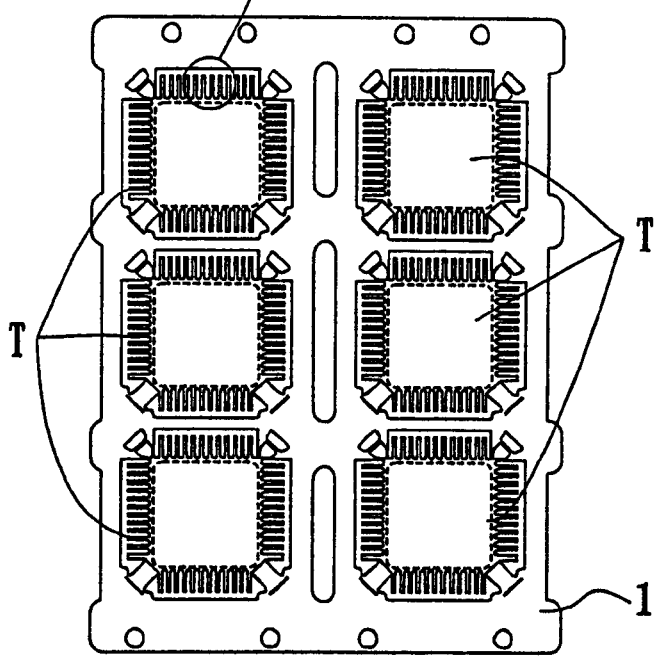

FIG. 6 is plan view of six frames T patterned according to the present invention, and FIG. 7 is an enlarged detail view of the patterned pins P. In the enlarged view of FIG. 7, different from known frames, the pins P are defined with their outermost portion that extends without constraints from the line of metal bridge connections, referred to as the dam bar. Their ends are separated from the surrounding metal of the matrix plate 1, commonly formed of copper, after die stamping the frames.

The dot and dash lines indicate the lines of cutting to be executed after completing encapsulation to separate electrically the pins from one another. No trimming of the ends of the pins occurs, as in prior art techniques. The stamped metal frames are then coated with one, or preferably more, superimposed thin films of selected metals by chemical and/or electrochemical metal deposition techniques over all their surfaces. Therefore, the end surfaces of the cantilever outermost portion of the pins P of the stamped frames are also coated like any other surface. The coating is typically with nickel and with a nickel-palladium or a palladium top coating having a thickness that may generally be between 0.03–0.08 $\mu$m.

Before depositing such a final top coating containing palladium or another noble metal, such as gold, that prevents the formation of insulating native oxide films, one or more adhesion layers containing a certain amount of noble metal may be deposited on the frame metal base to build a compatible and adherent solder-wettable coating. This coating is capable of promoting an effective soldering with an eutectic tin/lead alloy of the device onto the printed circuit board. Such multilayers may be composed of nickel and/or nickel-palladium films, deposited in succession, using different techniques. For example, a chemical deposition is used to prime the surface to receive a further coating of nickel by galvanic plating, on top of which a thin layer of noble metal is thereafter galvanically deposited.

The deposition techniques and the number and composition of the different metal layers deposited on the die stamped base metal of the patterned frame may be different and do not affect the overall scope of the present invention. The invention provides for an uncustomary patterning configuration of the die stamped frames. This avoids any trimming operations after coating of the patterned frame with the metal film, which has been found instrumental in preventing poor soldering during the successive mounting of the devices onto printed circuit boards.

Figure 8:
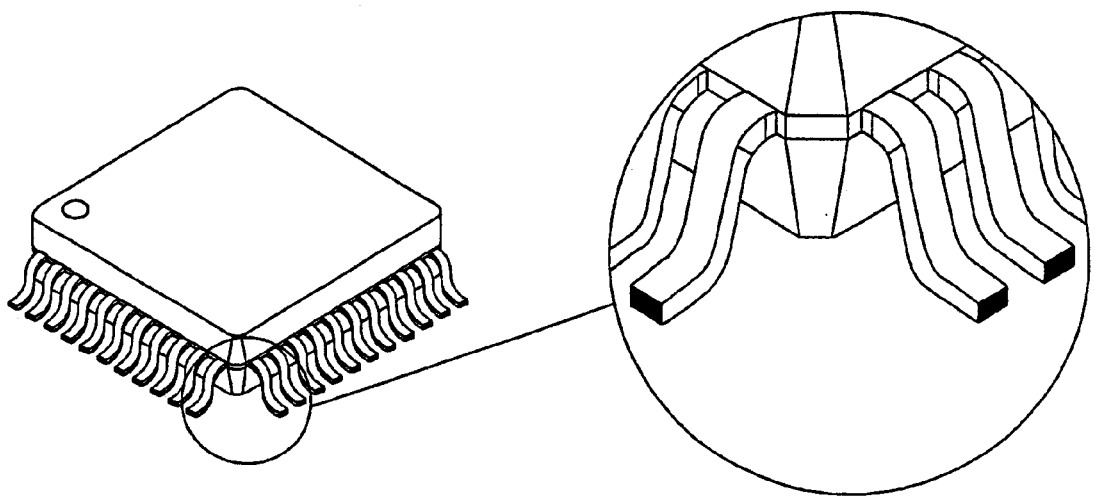
FIGS. 8 and 9 respectively show a comparison between pins of a surface mount device using prior art frames and frames made according to the present invention.
Figure 9:
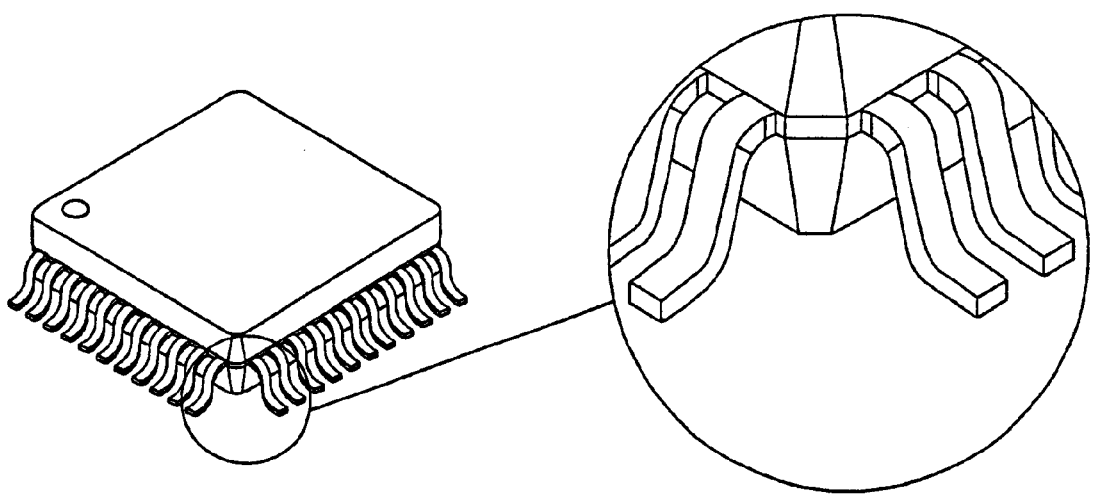

The frames formed according to the invention provide for an uninterrupted coating, even on the end surface of the pins, as pictorially shown in FIG. 9. This is different from prior art frames, where the pins are cut before or after bending them, as pictorially shown in FIG. 8 by way of comparison. The peculiar frame pattern and, in particular, the patterning of the outermost portion of the pins of the present invention, provide further advantages in terms of a better utilization of the metal strip.

Figure 10:
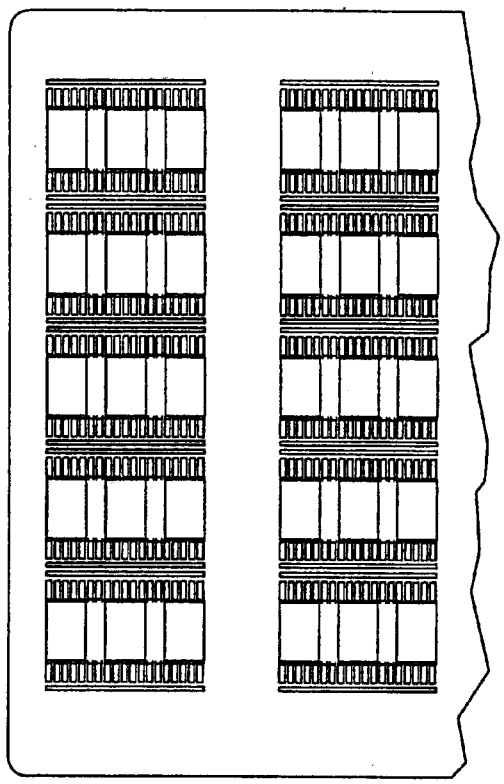
FIGS. 10 and 11 respectively are plan views of patterned frames made according to the prior art and according to the present invention.
Figure 11:
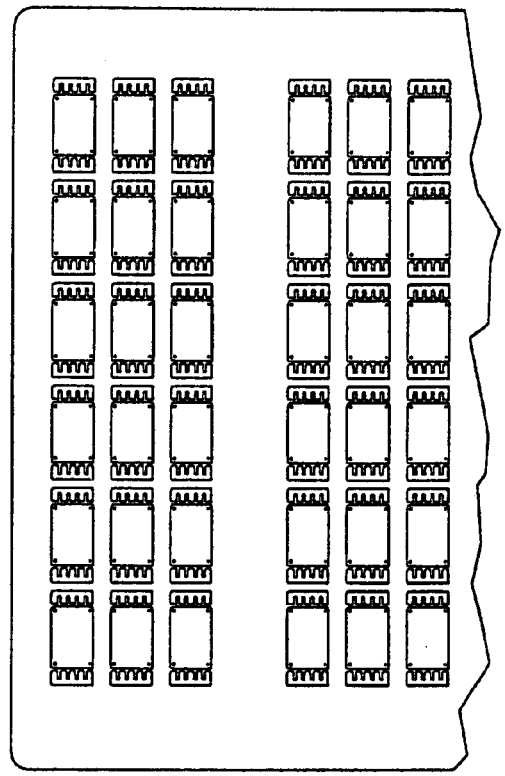

In practice, given a certain standardized metal strip length as normally handled by the die stamping machines, the frame pattern of the present invention permits a better utilization of the base strip, as may be appreciated by comparing FIGS. 10 and 11, wherein for identical lengths of the metal strip, the geometry of the frames of the invention (FIG. 11) permits production of a greater number of frames per unit length than in the case of a traditional geometry of patterned frames (FIG. 10).

That which is claimed is:

1. A method for making a metal frame for assembling an integrated device, the method comprising:

die stamping a metal plate to form a plurality of patterned pins with outermost portions of each patterned pin extending freely in a cantilever fashion;

coating the metal plate and the outermost portion of each patterned pin with at least one metal coating layer comprising a galvanically deposited nickel layer, and the at least one metal coating layer comprising a noble metal top coating layer comprising a galvanically deposited noble metal, the noble metal top coating layer having a thickness in a range of about 0.03–0.08 $\mu$m; and forming the plurality of pins into a predetermined shape without cutting the outermost portion of each patterned pin.

2. A method according to claim 1, wherein the at least one metal coating layer comprises a metal different from the metal plate.

3. A method according to claim 1, wherein the metal plate comprises copper.

4. A method according to claim 1, wherein the at least one metal coating layer comprises nickel and gold.

5. A method according to claim 1, wherein the at least one metal coating layer comprises nickel and palladium.

6. A method according to claim 1, wherein the noble metal comprises palladium.

7. A method according to claim 1, wherein the noble metal comprises gold.

8. A method for making a metal frame for assembling an integrated device for mounting on a printed circuit board, the method comprising:

die stamping a metal plate to form a plurality of patterned pins with outermost portions of each patterned pin extending freely in a cantilever fashion;

coating the metal plate and the outermost portion of each patterned pin with at least one metal coating layer comprising a galvanically deposited nickel layer, and the at least one metal coating layer comprising a galvanically deposited noble metal top coating layer; and forming the plurality of pins into a predetermined shape without cutting the outermost portion of each patterned pin.

9. A method according to claim 8, wherein the at least one metal coating layer comprises a metal different from the metal plate.

10. A method according to claim 8, wherein the metal plate comprises copper.

11. A method according to claim 8, wherein the at least one metal coating layer further comprises gold.

12. A method according to claim 8, wherein the at least one metal coating layer further comprises palladium.

13. A method according to claim 8, wherein the noble metal comprises palladium.

14. A method according to claim 8, wherein the noble metal comprises gold.

15. A method according to claim 8, wherein the top coating layer has a thickness in a range of about 0.03–0.08 $\mu$m.

* * * * *

UNITED STATES PATENT AND TRADEMARK OFFICE
CERTIFICATE OF CORRECTION

PATENT NO. : 6,518,099 B2
DATED : February 11, 2003
INVENTOR(S) : Andrea Giovanni Cigada and Fulvio Silvio Tondelli It is certified that error appears in the above-identified patent and that said Letters Patent is hereby corrected as shown below:

<u>Column 2,</u>
Line 41, delete "phase. of" insert -- phase of --

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,518,099 B2
DATED          : February 11, 2003
INVENTOR(S)    : Andrea Giovanni Cigada and Fulvio Silvio Tondelli It is certified that error appears in the above-identified patent and that said Letters Patent is hereby corrected as shown below:

<u>Title Page,</u>
Item [62], insert:
-- Foreign Application Priority Data
March 23, 1998 (EP) ................ 98830167.7 --.

Signed and Sealed this

Twenty-eighth Day of October, 2003

JAMES E. ROGAN
*Director of the United States Patent and Trademark Office*